(12) United States Patent
Hattar et al.

(10) Patent No.: US 10,210,964 B2
(45) Date of Patent: Feb. 19, 2019

(54) ION BEAM MODIFICATION OF NOBLE METALS FOR ELECTRICAL CONTACTS

(71) Applicant: National Technology & Engineering Solutions of Sandia, LLC, Albuquerque, NM (US)

(72) Inventors: Khalid Mikhiel Hattar, Albuquerque, NM (US); Jon-Erik Mogonye, Elgin, TX (US); Somuri V. Prasad, Albuquerque, NM (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 870 days.

(21) Appl. No.: 14/800,898

(22) Filed: Jul. 16, 2015

(65) Prior Publication Data
US 2016/0027547 A1  Jan. 28, 2016

Related U.S. Application Data

(60) Provisional application No. 62/028,603, filed on Jul. 24, 2014.

(51) Int. Cl.
| | | |
|---|---|---|
| H01B 1/02 | (2006.01) | |
| C22C 5/04 | (2006.01) | |
| C23C 14/02 | (2006.01) | |
| C23C 14/16 | (2006.01) | |
| C23C 14/30 | (2006.01) | |
| C23C 14/58 | (2006.01) | |
| C22C 5/02 | (2006.01) | |
| H01R 13/03 | (2006.01) | |

(52) U.S. Cl.
CPC .......... *H01B 1/02* (2013.01); *C22C 5/04* (2013.01); *C23C 14/025* (2013.01); *C23C 14/16* (2013.01); *C23C 14/30* (2013.01); *C23C 14/58* (2013.01); *C22C 5/02* (2013.01); *H01R 13/03* (2013.01)

(58) Field of Classification Search
None
See application file for complete search history.

(56) References Cited

U.S. PATENT DOCUMENTS 4,759,947 A * 7/1988 Ishihara .............. C23C 16/24
136/258

OTHER PUBLICATIONS

Cocks et al., The Ion Implantation of Helium into Gold, 1986, phys. stat. sol. (a) 95, pp. 141-148. (Year: 1986).*

(Continued)

*Primary Examiner* — Adam Krupicka
(74) *Attorney, Agent, or Firm* — Kevin W. Bieg

(57) ABSTRACT

Ion beam modification of noble metal electrical contact coatings can achieve suitable friction and wear behavior with inherently stable low ECR. For example, this method of producing Au electrical contact coatings can produce wear properties similar to electroplated hard Au, but without the environmental concerns due to stringent OSHA regulations on the use and disposal of toxic chemicals associated with Au electroplating baths. Integration of physical vapor deposition techniques with ion implantation can produce noble metal coatings with surfaces modified to achieve the desired balance between adhesion/friction/wear and electrical contact resistance on a commercial scale.

14 Claims, 9 Drawing Sheets

(56) References Cited

OTHER PUBLICATIONS

Abstract of Tishchenko et al., Study of processes at helium ion bombardment of thin silver films, 2006, Radiation Effects vol. 35—Issue 1-2. (Year: 2006).*
Knapp, J. A. et al., "Hardening by Bubbles in He-implanted Ni", Journal of Applied Physics, 2008, vol. 103, pp. 013518-1-013518-9.
Was, G. S., "Ion Beam Modification of Metals: Compositional and Microstructural Changes", Progress in Surface Science, 1989, vol. 32, pp. 211-332.
Sharon, J.A. et al., "Compressive Properties of (110) Cu Micro-Pillars after High-Dose Self-Ion Irradiation", Materials Research Letters, 2014, vol. 2, pp. 57-62.
Hartley, N.E.W., "Friction and Wear of Ion-Implanted Metals—A Review", Think Solid Films, 1979, vol. 64. pp. 177-190.
Sioshansi, P., "Ion Beam Modification of Materials for Industry", Thin Solid Films, 1984, vol. 118, pp. 61-71.
Iwaki, M., "Tribological Properties of Ion-implanted Steels", Materials Science and Engineering, 1987, vol. 90, pp. 263-271.
Onate, J.I., et al., "Improvement of Tribological Properties by Ion Implementation", Thin Solid Films, 1998, vol. 317, pp. 471-476.
Roboic, J. Y. et al., "Some Measurements of Hardness, Wear and Stresses in Ion Implanted Thin Metallic Films", Nuclear Instruments and Methods, 1981, vol. 182/183, pp. 919-922.

* cited by examiner

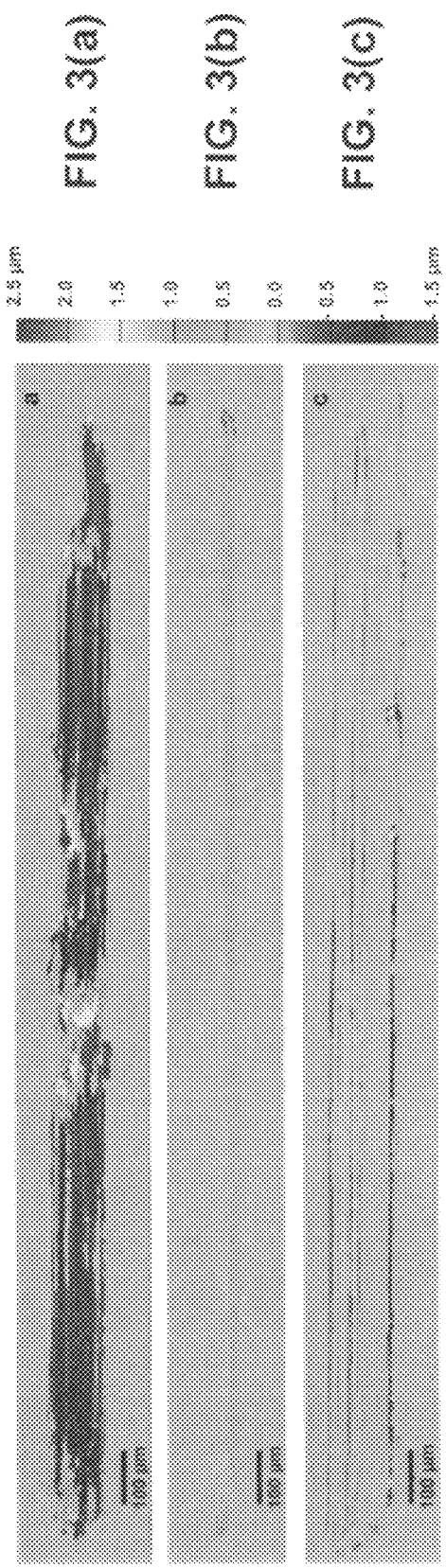

ION BEAM MODIFICATION OF NOBLE METALS FOR ELECTRICAL CONTACTS

CROSS-REFERENCE TO RELATED APPLICATION

This application claims the benefit of U.S. Provisional Application No. 62/028,603, filed Jul. 24, 2014, which is incorporated herein by reference.

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to electrical contacts and, in particular, ion beam modification of noble metals for electrical contacts.

BACKGROUND OF THE INVENTION

Materials used in coatings and thin films as electrical sliding contacts require stable low electrical contact resistance (ECR), as well as acceptable friction and wear performance. Gold is well suited as an electrical contact coating due to its low resistivity and excellent corrosion and oxide resistance and has found widespread industrial use due to its ease of deposition via electroplating. See P. Goodman, *Gold Bulletin* 35, 21 (2002). However, the high ductility and low yield strength of pure Au lend to poor tribological performance in sliding electrical contacts. Unlubricated sliding Au-on-Au contacts tend to exhibit unacceptable amounts of adhesive wear and friction coefficients exceeding 1.0 as a result of high real to apparent contact area. See F. P. Bowden and D. Tabor, *The friction and lubrication of solids*, Vol. 1 (Oxford university press), 2001; and M. Antler, *IEEE Transactions on Components Hybrids and Manufacturing Technology* 4, 15 (1981). However an increase in real area of contact between the contact pair minimizes the contribution of constriction resistance to the ECR of the system. See R. Holm and E. Holm, *Electric contacts: theory and application* (Springer-Verlag New York), 1967. The balance of these mechanisms in metallic friction and wear with ECR is highly dependent on the real area of contact and thus the mechanical properties of the Au film.

The most common approach to improving the tribological performance of Au films is to increase the film hardness by alloying with minute amounts of transition metals in electroplating, primarily Co and Ni, known as hard Au. See P. Goodman, *Gold Bulletin* 35, 21 (2002), and M. Antler, *Thin Solid Films* 84, 245 (1981). The primary mechanism for the increase in hardness is attributed to Hall-Petch strengthening achieved via grain refinement by boundary pinning during codeposition. See C. C. Lo et al., *Journal of Applied Physics* 50, 6887 (1979). However, the introduction of non-noble transition metals can result in surface oxide film formation via solute diffusion and increase ECR by an order of magnitude or greater with only a few monolayers. See M. Antler, *Plating and Surface Finishing* 85, 85 (1998); H. G. Tompkins, *Journal of The Electrochemical Society* 122, 983 (1975); and H. G. Tompkins and M. R. Pinnel, *Journal of Applied Physics* 48, 3144 (1977).

Ion beam modification (IBM) is a well-established technique for tailoring the electrical, thermal, optical, and mechanical properties of materials. This wide range of material properties that can be tailored by ion beams are a result of the unique non-equilibrium microstructures that can be created by IBM. See M. Nastasi, M., *Ion-solid interactions: fundamentals and applications* (Cambridge University Press) 1996; and S. Zinkle, *Radiation effects and defects in solids* 148, 447 (1999). In ductile metals, it has previously been shown that IBM can significantly increase the hardness and strength of the film often at the deterioration of ductility. See J. A. Knapp et al., *Journal of Applied Physics* 103, 013518 (2008); G. S. Was, *Progress in Surface Science* 32, 211 (1989); and J. Sharon et al., *Materials Research Letters*, 1 (2013). However reports on the use of IBM to improve tribological performance of metals has mainly focused on steel and Ti alloys implanted with metallic and other ion species such as N that can form precipitates or react chemically with host species to form new phases. See N. Hartley, *Thin Solid Films* 64, 177 (1979); P. Sioshansi, *Thin Solid Films* 118, 61 (1984); M. Iwaki, *Materials Science and Engineering* 90, 263 (1987); and J. Onate et al., *Thin Solid Films* 317, 471 (1998). There is a single report describing ion implantation in thin metallic films of Cu, Au, and Al that resulted in an increase in hardness. However, improved wear was only observed in Cu. Further, there was no report of the effect of ion implantation on friction or electrical contact resistance. See J. Y. Robic et al., *Nuclear Instruments & Methods* 182, 919 (1981).

Therefore, a need remains for noble metal electrical contact coatings that can achieve suitable friction and wear behavior with inherently stable low ECR.

SUMMARY OF THE INVENTION

The present invention is directed to an electrical contact comprising a noble metal thin film that has been ion implanted with a noble gas. For example, the noble metal can comprise Au, Pd, Ag, or Pt. For example, the noble gas can comprise He, Ne, Ar, Kr, or Xe ion implanted to a dose of between than $1\times10^6$ ions-cm$^{-2}$ and $1\times10^{20}$ ions-cm$^{-2}$. The invention is further directed to a method for fabricating an electrical contact comprising depositing a noble metal film on a substrate and ion implanting a noble gas into the noble metal film at energy of between 1 keV and 10 Mev.

As an example of the invention, high purity Au films were deposited on Si substrates by physical vapor deposition. E-beam evaporation was used to deposit the films; however other techniques such as sputtering can be used. The films were then implanted with He ions accelerated at energies of 22.5 keV and 1.2 MeV to a dose of $1\times10^{12}$ cm$^{-2}$ and $1\times10^{16}$ cm$^{-2}$ respectively. Friction, wear, and electrical contact resistance measurements were made with a hemispherical tipped Au—Cu alloy pin. Friction coefficients of the He implanted films showed a threefold reduction compared with un-implanted films, from 1.5 to 0.5. A thirty fold reduction in wear was observed for the He ion implanted Au (E=22.5 keV) compared with the un-implanted film. Electrical contact resistance remained practically unaltered as a result of He ion implantation. Transmission electron microscopy confirmed that He ion implantation can facilitate the formation and stabilization of equiaxed nanocrystalline structures in the near surface formed during the wear process.

This method of producing Au electrical contact coatings can produce wear properties similar to electroplated hard Au, but without the environmental concerns due to stringent OSHA regulations on the use and disposal of toxic chemicals associated with Au electroplating baths. Other noble gas species such as argon can provide similar beneficial effects when implanted into Au. Integration of physical vapor deposition techniques with ion implantation can produce Au coatings with surfaces modified to achieve the desired balance between adhesion/friction/wear and electrical contact resistance on a commercial scale.

BRIEF DESCRIPTION OF THE DRAWINGS

The detailed description will refer to the following drawings, wherein like elements are referred to by like numbers.

FIGS. 3(a)-(c) are scanning white light interferometry spectral topographical maps of film surfaces after 100 sliding cycles at applied load of 100 mN for (a) un-implanted Au, (b) Au implanted with E=22.5 keV, $\phi=1\times10^{12}$ cm$^{-2}$, and (c) Au implanted with E=1.2 MeV, $\phi=1\times10^{16}$ cm$^{-2}$ He ions.

DETAILED DESCRIPTION OF THE INVENTION

The present invention is directed to novel noble metal electrical contact coatings that can achieve suitable friction and wear behavior with inherently stable low ECR. Ion beam modification of noble metals using noble gasses can alter the adhesion, friction, and wear behavior without adversely affecting the electrical conductivity. The architecture of the implanted regions (noble gas bubble size, density and distribution) can be tailored by altering the ion energy and dose. As an example of the invention, sliding electrical contact performance of Au films modified by noble He gas ion implantation has been investigated, specifically the impact of single energy implantations of He ions on the friction, wear, and ECR of high-purity Au thin films prepared via physical vapor deposition. He ions can be implanted into sputtered Au films in conditions available at microfabrication facilities. Ion implantation of noble gasses into Au is a novel and environmentally friendly alternative to electroplated hard gold for electrical contacts.

Pure Au films were deposited by e-beam evaporation of high purity Au pellets (99.999%) onto Si substrates. Approximately 10 mm$^2$ Si wafers were first sputtered with Ti and Pt adhesion layers of nominally 0.5 μm thickness each to increase adhesion. The e-beam evaporation was conducted at room temperature with a source to substrate distance of 530 mm while rate of deposition was controlled using feedback from a quartz microbalance to produce nominally 1.8 μm thick Au films. The vacuum system was pumped to a base pressure of $1\times10^{-6}$ Torr before beginning deposition. The as deposited films were then implanted with a mass corrected $^3$He$^+$ ion beam generated by a 350 kV implanter. The ion beam was rastered over nominally 10 mm$^2$ area to yield a spatially homogeneous distribution of implanted He. Implantations were conducted under a base pressure of $1\times10^{-7}$ Torr at nominally room temperature. Specimens were implanted with individual energies (E) of 22.5 keV and 1.2 MeV to a dose ($\phi$) of $1\times10^{12}$ and $1\times10^{16}$ ions-cm$^{-2}$, respectively. The employed implantation energies were chosen based on Stopping and Range of Ions in Matter (SRIM) 2008 modeling to yield an implantation distribution of He in the film at the near surface with a mean depth of 48 nm for E=22.5 keV and a mean depth near the Au—Pt interface of 1.8 μm for E=1.2 MeV. See J. F. Ziegler, *Nuclear Instruments & Methods in Physics Research Section B-Beam Interactions with Materials and Atoms* 219, 1027 (2004). Post implanted samples and as deposited Au films were cleaned via O$_2$ sourced plasma for a minimum of 10 minutes to remove any surface carbonaceous species before sliding wear experiments.

Figure 1:
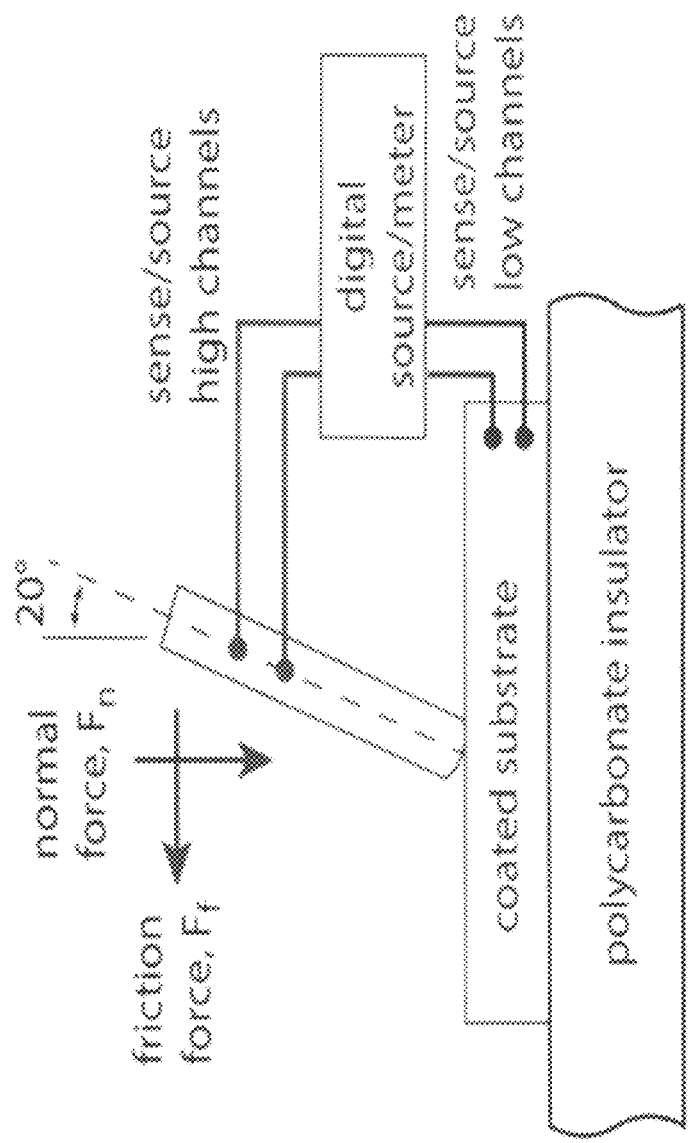
FIG. 1 is a schematic illustration of an ECR tribometer circuit in relation to pin and coated substrate.

Tribological evaluations of the films were made in pin-on-disk configuration using a linear ECR tribometer equipped with a digital source/meter, shown schematically in FIG. 1. Pins of annealed Au—Cu alloy (nominally 72Au-14Cu-8Pt-5Ag by weight) cylinders were turned to produce a hemispherical tip with a 1.59±0.05 mm radius and were subsequently hand lapped to a center line average roughness ($R_a$)<100 nm. Fixturing of the alloy pin at a canted angle of 20° allowed for multiple sliding tests per pin by rotation about its cylindrical axis. Unidirectional dry sliding tests 2 mm in length were conducted for 100 cycles at room temperature in lab air (15-30% RH). A normal force of 100 mN and a linear speed of 1 mm-s$^{-1}$ were used for each measurement. Continuous ECR measurements were conducted with the source/meter in voltage-regulated remote-sensing mode by measuring the voltage drop and current using a four-point probe bridged across the film surface and the pin. Prior to sliding for each experiment a static normal force of 100 mN was applied and a voltage set to produce approximately 100 mA of direct current through the ECR circuit. Normal force, friction force, wear track position, ECR circuit current, and voltage drop across the contact were acquired and recorded at a rate of 50 Hz.

Topographical features of unworn and worn surfaces after 100 sliding cycles of the Au films and pins were measured using a scanning white light interferometer (SWLI) with a 50× objective lens. Volumes of film wear and transfer films to the pins were calculated from the SWLI maps using the Vision64 version 5.41 software. Wear volumes of the tracks generated on the films was measured as volume displaced below a reference plane fitted outside the wear track and used to calculate the specific wear rate, k (mm$^3$-(Nm)$^{-1}$), where the denominator is the product of applied normal force and total sliding distance. Transfer volumes and wear of pin surfaces were measured as the volume above or below a reference spherical planar fitting of the hemispherical geometry.

Electrical resistivity values of the films were characterized using a four-point probe technique to measure the combined sheet resistance of the Au film and the Pt and Ti adhesion layers using a source/meter. Two sheet resistance values were recorded in unique probe positions in accordance with the van der Pauw method. See L. J. van der Pauw, *Philips Research Reports* 13, 1 (1958). With the as deposited Au, Pt, and Ti layers treated as resistors in parallel giving rise to the measured sheet resistance, the Au film resistivity could then be calculated with the thickness of each layer taken as the deposited thickness with the procedure presented by van der Pauw.

Film cross-sections of unworn and post 100 sliding cycles of wear films were prepared for scanning transmission electron microscopy (STEM) via ex-situ focused ion beam (FIB) lift-outs with a final thinning using low kV Ga$^+$ ion milling. The worn cross-section lift-outs were FIB milled at the center of the wear track corresponding to the point of maximum Hertzian contact stress and parallel to the direction of relative sliding. STEM high angle annular dark field (HAADF) micrographs were collected using a FEI Titan G2 STEM operating at 200 kV. HAADF imaging was chosen to elucidate visualization of potential He bubbles or cavities due to high atomic mass contrast while retaining Au film structures in focus.

Friction

Figure 2A:
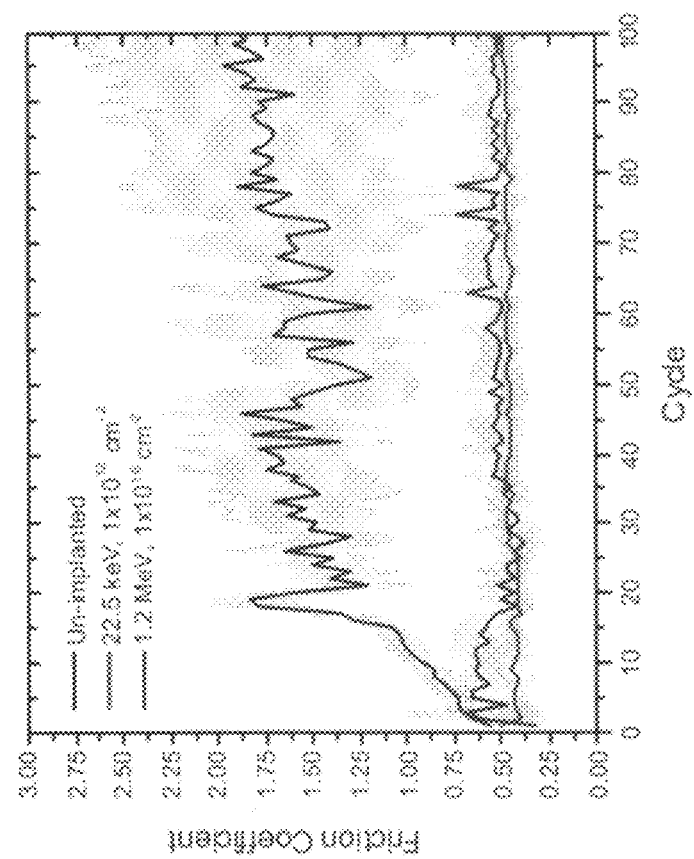
FIG. 2(a) is a graph of uni-directional sliding friction coefficient versus sliding cycle against Au—Cu alloy pins for un-implanted Au, and Au implanted with E=22.5 keV, $\phi=1\times10^{12}$ cm$^{-2}$, and E=1.2 MeV, $\phi=1\times10^{16}$ cm$^{-2}$ He ions.
Figure 2B:
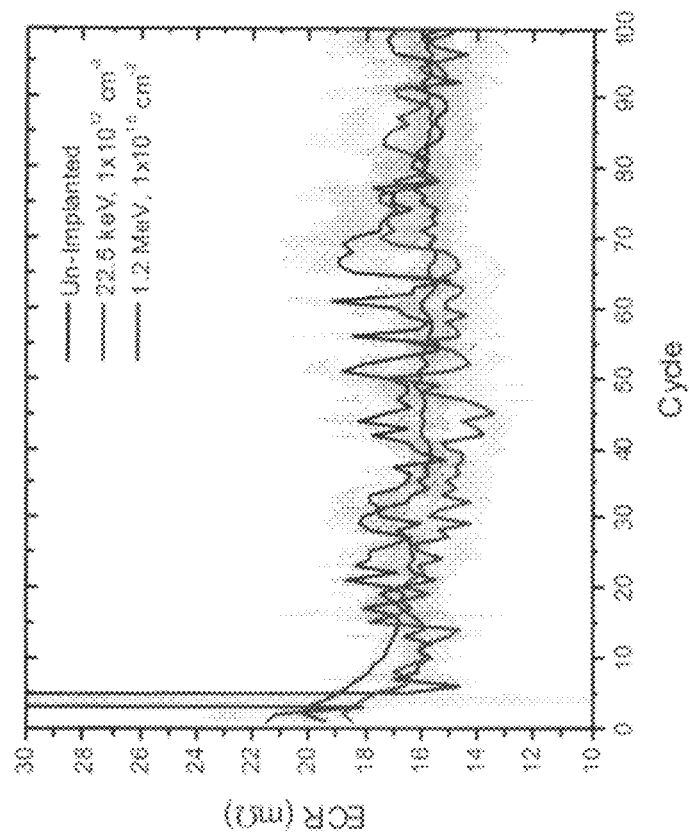
FIG. 2(b) is a graph of uni-directional sliding ECR versus sliding cycle against Au—Cu alloy pins for un-implanted Au, and Au implanted with E=22.5 keV, $\phi=1\times10^{12}$ cm$^{-2}$, and E=1.2 MeV, $\phi=1\times10^{16}$ cm$^{-2}$ He ions. Shaded regions correspond to ±1σ per cycle of data collected at 50 Hz.

The evolution of friction coefficient data collected at a rate of 50 Hz during uni-directional sliding ECR experiments against Au—Cu pins have been plotted against sliding cycle in FIG. 2(*a*) for un-implanted, E=22.5 keV, and E=1.2 MeV He ion implanted Au films. Due to the high acquisition rate and a sliding speed of 1 mm-s$^{-1}$ large data sets were acquired per cycle. For this reason the friction coefficient per cycle has been plotted as the mean value with a solid line with the corresponding shaded regions representing ±one standard deviation ($\sigma$) of the data per cycle. The un-implanted Au film exhibited a rapid run in period over ~20 cycles of increasing friction coefficient before reaching a value of approximately 1.5-1.75, similar to reports of wrought Au. See M. Antler, *IEEE Transactions on Components Hybrids and Manufacturing Technology* 4, 15 (1981). In contrast to the un-implanted Au, the E=1.2 MeV He implanted film exhibited a slight run in period over the first 20 cycles before decreasing and stabilizing near a value of 0.5. The E=22.5 keV He implanted film showed no run in behavior in friction coefficient over the 100 cycles of testing with a value of ~0.45. It is apparent that both He ion implanted films had a significant reduction in average friction coefficient with increased stability as shown by reduction in variance in comparison to the un-implanted film.

Sliding ECR and Resistivity

Sliding ECR values per cycle are shown in FIG. 2(*b*), with the mean value plotted as a solid line and shaded regions representing ±1$\sigma$ per cycle for the same reasons as explained above for friction coefficient. The un-implanted film exhibited a decrease in ECR during the first 20 cycles corresponding to the run in period of the friction coefficient before obtaining a more steady state value of ~17 ma although with increased variance. The E=22.5 keV He implanted film also exhibited a slight run in ECR from a starting value of ~19 m$\Omega$ before entering a higher variance regime similar to the un-implanted film. The run in period of ECR for the E=1.2 MeV He implanted film appears to decrease over the first 10 cycles before reaching an average value of ~16 m$\Omega$, however the values off the plotted scale in the first 5 cycles are data loss, likely due electrical contact separation. The E=1.2 MeV He implanted film did exhibit the least amount of variance of the films tested after the initial 10 cycles. The film resistivity values from four point probe measurements prior to sliding ECR experiments are reported in Table 1. Both He implanted films showed a decrease in resistivity that correlate with the average sliding ECR values also reported in Table 1.

TABLE 1

Measured values of Au film resistivity, average sliding ECR, specific wears rate (k), and transfer volume onto Au—Cu alloy pin for un-implanted and He implanted films. Negative values of transfer film volume correspond to net volume loss of the rider.

| He Ion Implant Conditions | Au Film Resistivity (m$\Omega$-cm) | Average Sliding ECR (m$\Omega$) | Specific Wear Rate, k (mm$^3$-(Nm)$^{-1}$) | Transfer Film Volume ($\mu$m$^3$) |
|---|---|---|---|---|
| Un-implanted | 2.62 ± 0.10 | 17.0 ± 1.5 | 4.3 × 10$^{-3}$ | 8239 |
| E = 22.5 keV<br>$\phi$ = 1 × 10$^{12}$ cm$^{-2}$ | 3.11 ± 0.05 | 15.8 ± 1.7 | 1.3 × 10$^{-4}$ | −14 |
| E = 1.2 MeV<br>$\phi$ = 1 × 10$^{16}$ cm$^{-2}$ | 2.79 ± 0.42 | 16.1 ± 0.3 | 1.0 × 10$^{-3}$ | 263 |

Wear Surface Profiles

FIGS. 3(*a*)-(*c*) show SWLI spectral topographical maps generated from stitched data sets of wear tracks post 100 sliding cycles against Au—Cu alloy pins under a 100 mN load for (a) un-implanted, (b) E=22.5 keV He implanted, and (c) E=1.2 MeV He implanted Au films. The un-implanted film showed the highest degree of wear with depths reaching 1.5 μm into the film. Large volumes of displaced volume are observed near the center of the wear track indicative of adhesive transfer to the Au—Cu pin and retransfer to the film surface as well as large accumulation of debris near the end of the track likely due to a plowing mechanism. In contrast the E=22.5 keV He implanted film showed significant reduction in wear depth, ~0.5 μm, and wear track width with minimal accumulation of debris at the end of the wear track. The worn area is also considerably smoother with no evidence of adhesive pull-out of material. The E=1.2 MeV He implanted wear track exhibits surface striations indicative of micro-abrasive wear, but also showed significant reductions in maximum wear depth over that of the un-implanted film. It is clear from the SWLI topographical features that wear reduced for the He implanted films along with a change in wear mechanisms. The specific wear rates calculated from the negatively displaced volumes for each film are reported in Table 1 and reveal a 33 and 4.3 times reduction in comparison to the un-implanted film for the E=22.5 keV and E=1.2 MeV He implanted films respectively.

Figure 4A:
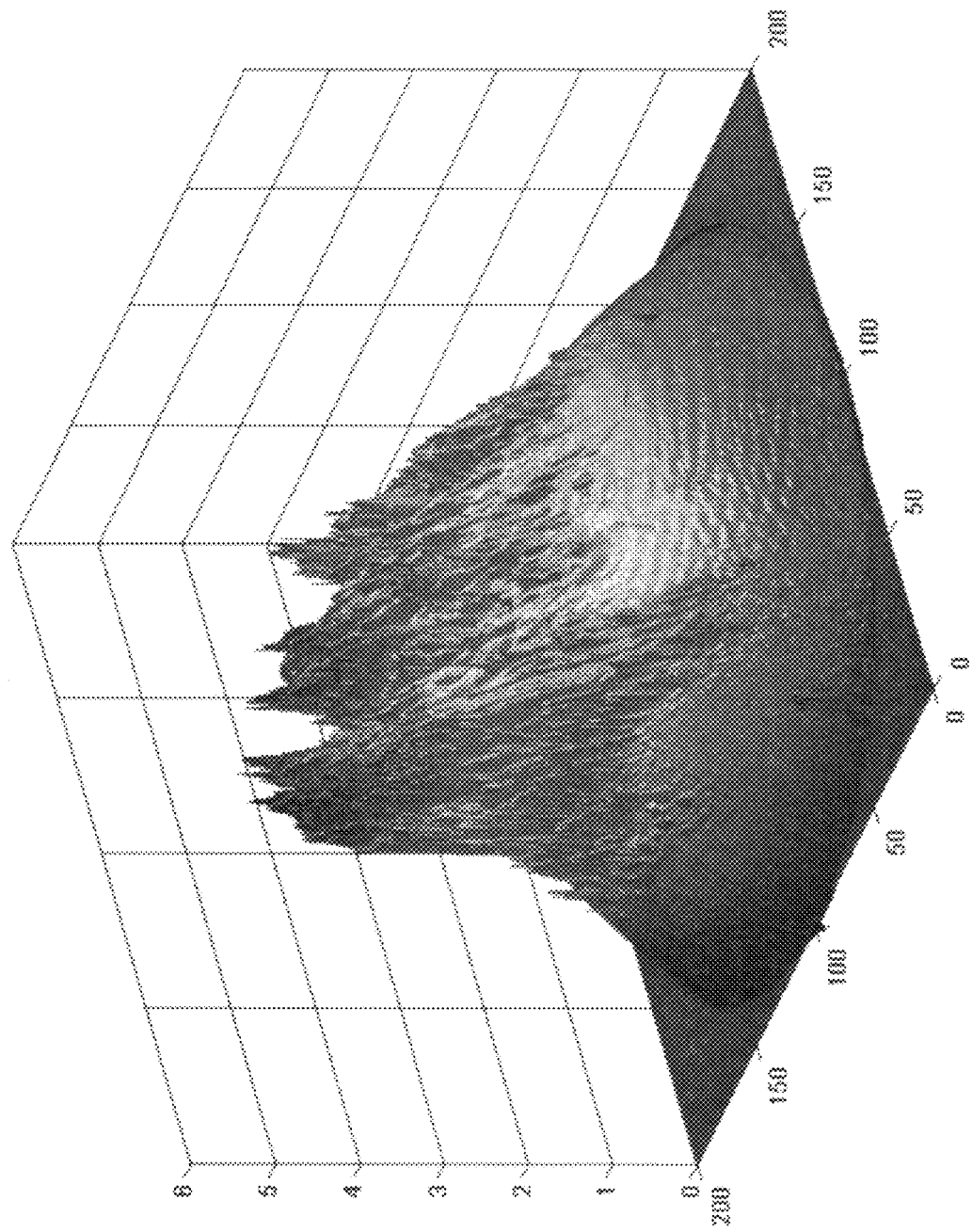
FIGS. 4(a)-(c) are scanning white light interferometry 3-D topographical reconstructions of Au—Cu alloy pin surfaces after 100 sliding cycles at applied load of 100 mN for (a) un-implanted Au, (b) He ion implanted with E=22.5 keV, $\phi=1\times10^{12}$ cm$^{-2}$, and (c) He ion implanted with E=1.2 MeV, $\phi=1\times10^{16}$ cm$^{-2}$. All units are in μm.
Figure 4B:
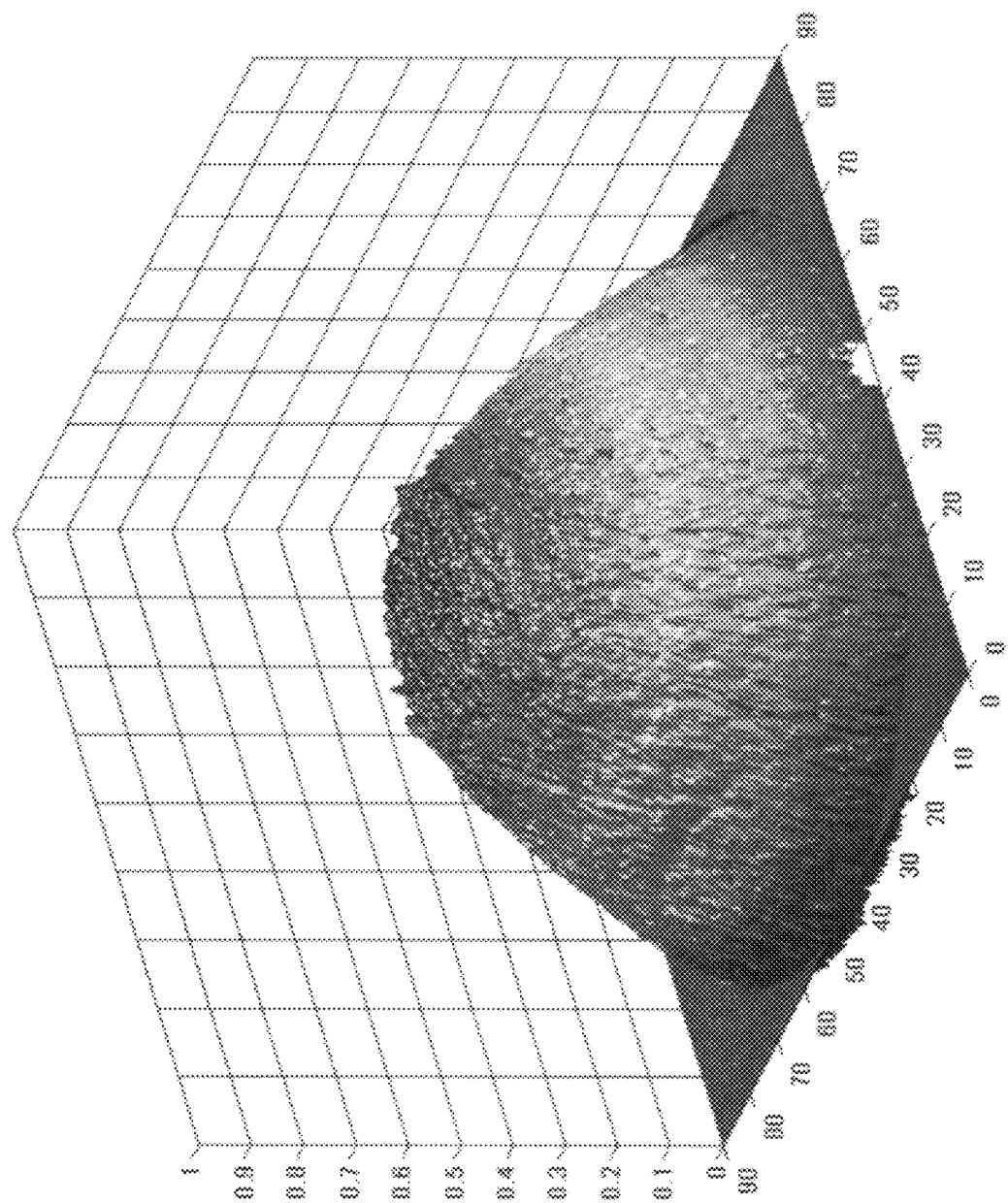
Figure 4C:
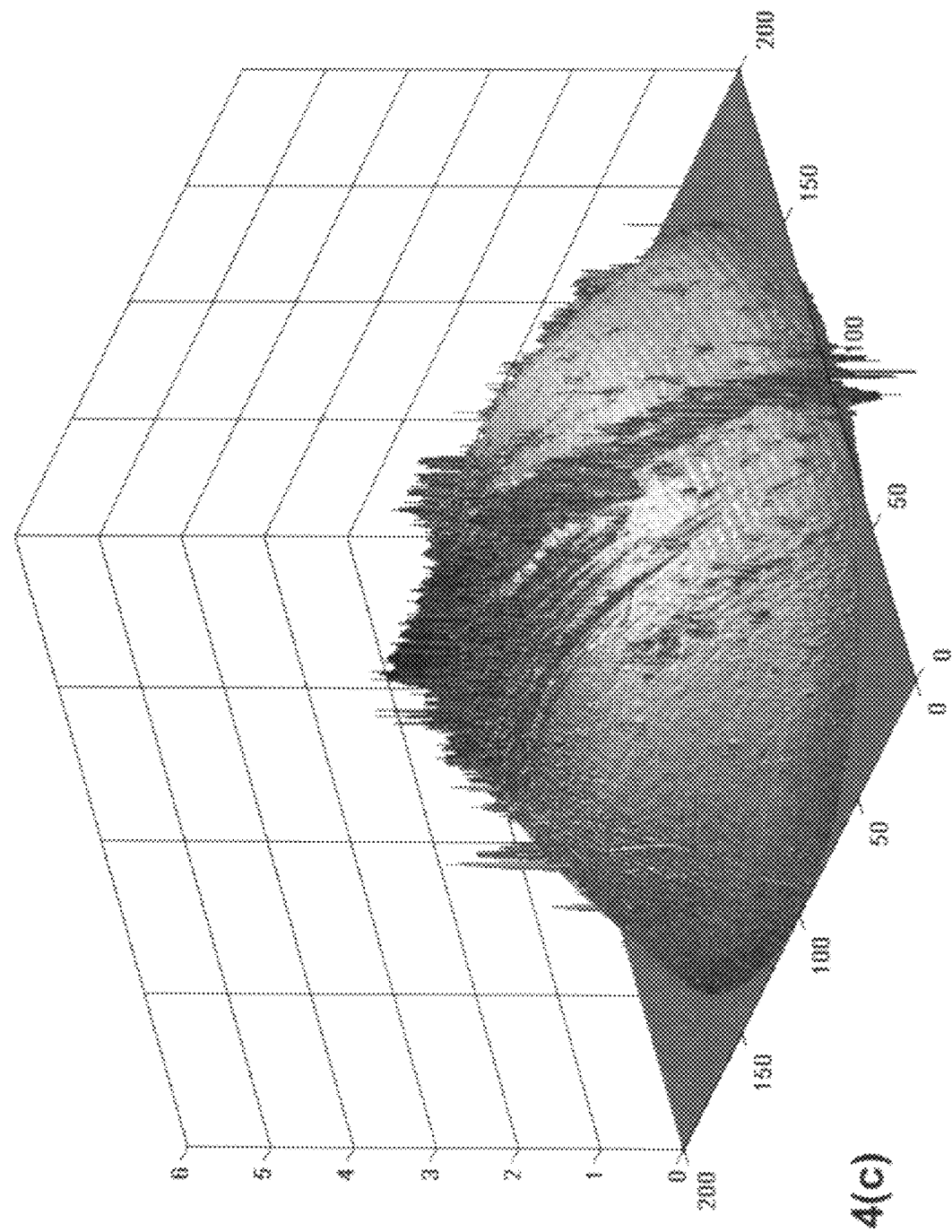

FIGS. 4(*a*)-(*c*) show the SWLI 3-D topographical reconstruction of the Au—Cu alloy pin surfaces post 100 sliding ECR cycles against (a) un-implanted, (b) E=22.5 keV He implanted, and (c) E=1.2 MeV He implanted Au films with transfer film volumes reported in Table 1. The worn pin surface post sliding against the un-implanted film clearly shows large a volume of adhesive transfer from film to pin and agrees with the rough wear surface and adhesive pull-out seen in FIG. 3(a). The worn pin surface for the E=22.5 keV He implanted film however shows no adhesive transfer but a worn flat that is in agreement with the measured negative transfer film volume. The lack of adhesive transfer film is in agreement with the reduced wear and smooth surface observed in the wear track in FIG. 3(b). The worn pin in FIG. 4(c) reveals a significant reduction in adhesive transfer from the film and also exhibits surface scratches matching the micro-abrasion morphology of the E=1.2 MeV film wear track. It is evident from the pin surfaces that wear mechanisms are different for the He implanted films in comparison to the large adhesive transfer onto the pin surface in sliding contact with the un-implanted film.

HAADF Stem

Figure 5A:
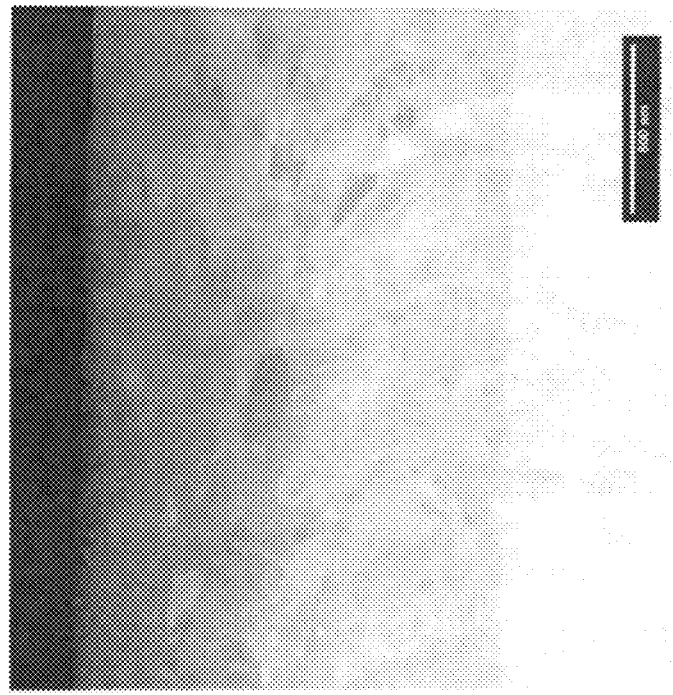
FIGS. 5(a)-(b) are STEM cross-sectional images of un-implanted Au films for (a) pre-wear, and (b) post 100 sliding cycles of wear. Relative sliding direction of the film in (b) is from left to right.
Figure 5B:
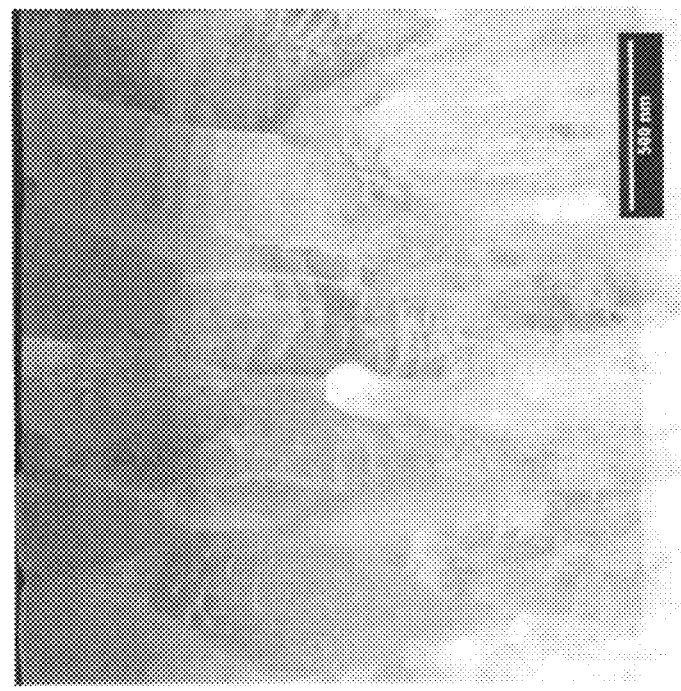

FIG. 5(a) shows the STEM image of the un-implanted film cross-section. The film structure consisted of segmented columnar grains with an average grain diameter on the order of 200-300 nm that are typical for evaporated metallic films grown near room temperature. See C. R. M. Grovenor et al., *Acta Metallurgica*, 32, 773 (1984). Selected area diffraction (SAD, not shown) of the as deposited film revealed a <111> out of plane texture. FIG. 5(b) shows the HAADF STEM image of the un-implanted film after 100 sliding cycles. Significant grain refinement throughout the thickness of the Au film to the Au—Pt interface due to tribological sliding stress is observed.

Figure 6A:
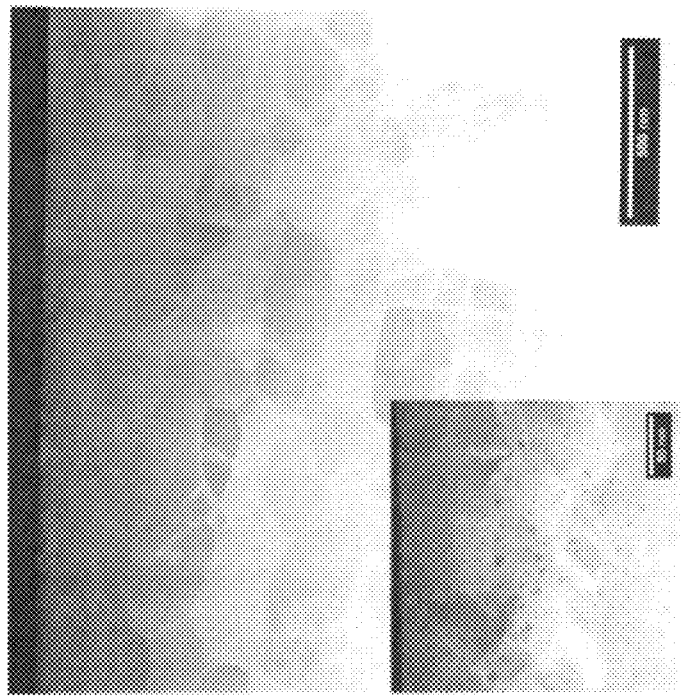
FIGS. 6(a)-(b) are HAADF STEM cross-sectional images of E=22.5 keV, $\phi=1\times10^{12}$ cm$^{-2}$ He implanted films for (a) pre-wear, and (b) post 100 cycles of sliding wear. Inserts show higher magnification of the near surfaces.
Figure 6B:
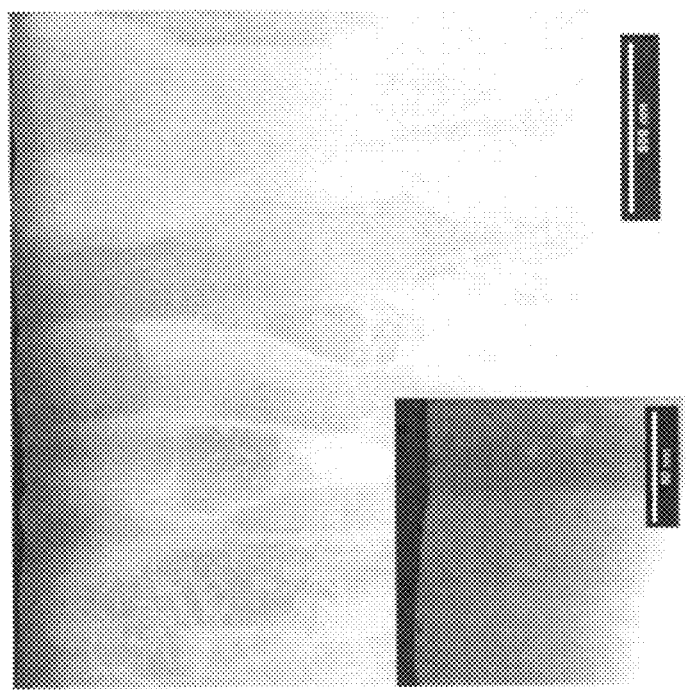

FIG. 6(a) shows a HAADF STEM image of the Au implanted with E=22.5 keV He. The grain structure of the film was similar to the un-implanted film with a segmented columnar structure of similarly sized grain diameters indicating that the film did not experience significant heating and grain growth due to implantation. The inset image in FIG. 6(a) shows a higher magnification HAADF STEM image of the near surface and revealed a bi-modal distribution of cavities with diameters, d~5 nm features in the top 10 nm of the film and d~1 nm features extending to a depth of 100 nm that are in good agreement with SRIM predictions. The post sliding wear film in FIG. 6(b) revealed grain refinement from the initial columnar structure to more equiaxed grains beginning at approximately 200 nm from the surface and extending to the Au—Pt interface. This grain refinement is much less significant that that observed in the un-implanted film. The inset image in FIG. 6(b) shows a higher magnification of the near surface and reveals a much greater density of previously unobservable cavities extending up to 220 nm into the film with an increase in average diameter in comparison to the unworn film. This upper zone of the film encompassing the observed cavities had much more significant grain refinement with grain sizes on the order of 20-50 nm.

Figure 7B:
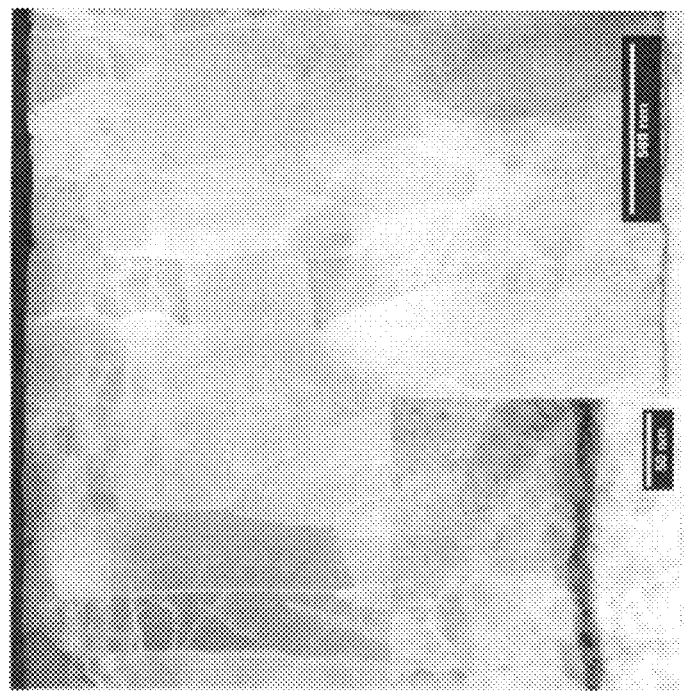
FIGS. 7(a)-(b) are HAADF STEM cross-sectional images of E=1.2 MeV, $\phi=1\times10^{16}$ cm$^{-2}$ He implanted films for (a) pre-wear, and (b) post 100 cycles of sliding wear. Inserts show higher magnification of the Au—Pt layer interface.
Figure 7A:
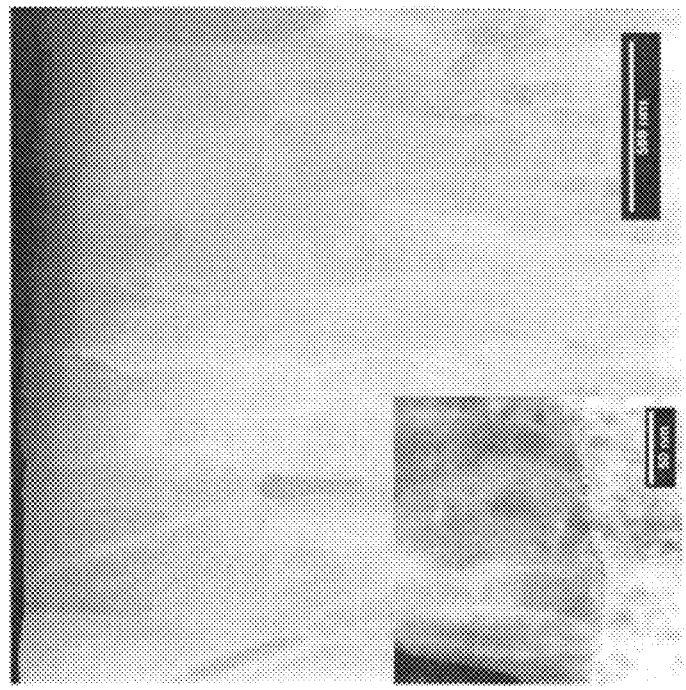

FIG. 7(a) shows the HAADF STEM image of the E=1.2 MeV implanted film. The columnar structure of similar grain diameter to that of the un-implanted film suggest that even at higher energy and dose to that of the E=22.5 keV film no significant heating and recrystallization is present. The inset image of FIG. 7(a) revealed that He implanted structures have reached the interface as predicted by SRIM, but that nearly all observable cavities reside very near or at the interface similar to results reported in Cu—Nb interfaces. See N. Li et al., *International Journal of Plasticity* 32, 1 (2012). The HAADF STEM image of the E=1.2 MeV implanted film post 100 sliding cycles and shown in FIG. 7(b) revealed a similar grain structure to that of the unworn film. The inset image in FIG. 7(b) shows a higher magnification of the Au—Pt interface of the worn film. Observed cavity growth and coalescence appears to be mainly localized at the Au—Pt interface. This localization of cavity coalescence at the interface of the Au and Pt could potentially lead to a weakened coating adhesion and delamination at higher wear cycles.

The present invention has been described as ion beam modification of noble metals for electrical contacts. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A sliding electrical contact, comprising a pair of contacts having contact surfaces that slide relative to each other, wherein at least one of the pair comprises a noble metal thin film that has been ion implanted with a noble gas and wherein the ion implanted noble metal thin film has a friction coefficient of less than 1.5.

2. The sliding electrical contact of claim 1, wherein the noble metal comprises Au.

3. The sliding electrical contact of claim 1, wherein the noble metal comprises Pd, Ag, or Pt.

4. The sliding electrical contact of claim 1, wherein the noble gas comprises He, Ne, Ar, Kr, or Xe.

5. The sliding electrical contact of claim 1, wherein the noble gas is ion implanted to a dose of greater than $1 \times 10^6$ ions-cm$^{-2}$ and less than $1 \times 10^{20}$ ions-cm$^{-2}$.

6. The sliding electrical contact of claim 1, wherein the thickness of the noble metal thin film is less than 10 microns.

7. A method for fabricating a sliding electrical contact, comprising:
depositing a noble metal film on a substrate, and
ion implanting a noble gas into the noble metal film to provide a first contact having a friction coefficient of less than 1.5; and
providing a second contact, wherein the surface of the second contact slides relative to the surface of the first contact.

8. The method of claim 7, wherein the noble metal comprises Au.

9. The method of claim 7, wherein the noble metal comprises Pd, Ag, or Pt.

10. The method of claim 7, wherein the noble gas comprises He, N Ar, Kr, or Xe.

11. The method of claim 7, wherein the depositing comprises physical vapor deposition.

12. The method of claim 11, wherein the physical vapor deposition comprises e-beam evaporation.

13. The method of claim 7, wherein the noble gas is ion implanted to a dose of greater than $1 \times 10^6$ ions-cm$^{-2}$ and less than $1 \times 10^{20}$ ions-cm$^{-2}$.

14. The method of claim 7, wherein the noble gas ions are implanted at an energy greater than 1 keV and less than 10 MeV.

* * * * *